United States Patent [19]
MacDonald et al.

[11] Patent Number: 4,727,349
[45] Date of Patent: Feb. 23, 1988

[54] DEPLETED CHANNEL PHOTOCONDUCTOR

[75] Inventors: Robert I. MacDonald, Ottawa; Dennis K. W. Lam, Nepean; Julian P. Noad, Carp, all of Canada

[73] Assignee: Canadian Patents & Development Limited, Ottawa, Canada

[21] Appl. No.: 897,652

[22] Filed: Aug. 18, 1986

[51] Int. Cl.$^4$ .............................................. H01L 31/08
[52] U.S. Cl. ..................................................... 338/15
[58] Field of Search ...................... 357/55, 23.14, 23.4, 357/4; 250/339; 338/15

[56] References Cited

U.S. PATENT DOCUMENTS

| | | | |
|---|---|---|---|
| 4,346,394 | 8/1982 | Figueroa et al. | 357/55 X |
| 4,427,990 | 1/1984 | Nishizawa | 357/23.4 X |
| 4,490,709 | 12/1984 | Hammond et al. | 338/15 |
| 4,598,305 | 7/1986 | Chiang et al. | 357/23.14 X |

OTHER PUBLICATIONS

R. I. MacDonald et al, "Depleted Layer Photoconductor", ECOC '85, pp. 553-556.
C. W. Slayman et al, "Frequency and Pulse Response of a Novel High Speed Interdigital Surface Photoconductor (IDPC)", IEEE 1981, pp. 112-114.
H. Beneking, "On the Response Behavior of Fast Photoconductive Optical Planar and Coaxial Semiconductor Detectors", 1982 IEEE, pp. 1431-1441.
J. C. Gammel, "An Epitaxial Photoconductive Detector for High Speed Optical Detection", 1979 IEEE, pp. 634-637.
C. Y. Chen et al, "Interdigitated Al$_{0.48}$In$_{0.52}$As/Ga$_{0.47}$In$_{0.53}$As Photoconductive Detectors", Appl. Phys. Lett. 44 (1), Jan. 1, 1984, pp. 99-101.
R. I. MacDonald et al, "Optoelectronic Switch Matrices: Recent Developments", Optical Engineering, vol. 24, pp. 220-224, 1985.

*Primary Examiner*—E. A. Goldberg
*Assistant Examiner*—M. Lateef
*Attorney, Agent, or Firm*—Y. Toyooka

[57] ABSTRACT

Photoconductors with channels that lie in the surface depleted region of a GaAs structure are described. These devices have nanoampere bias current, and exhibit photoconductive gain. In contrast to other photoconductors, their low frequency responsivity is of the same order as that in the GHz region, alleviating problems of equalization necessary in receiver applications. As well, these devices exhibit over 60 dB isolation as optoelectronic switches.

11 Claims, 4 Drawing Figures

DEPLETED CHANNEL PHOTOCONDUCTOR

FIELD OF THE INVENTION

This invention relates to photoconductors in general and in particular photoconductive devices made of semiconductive material and having a depleted channel layer.

BACKGROUND OF THE PRESENT INVENTION

Photoconductors made from epitaxial layers of GaAs or related semiconductor compounds have shown considerable promise as detectors for optical communications and as optoelectronic crosspoint switches. As switches, they provide over 60 dB isolation, 1 GHz bandwidth, low switching bias and subnanosecond switching time. (see Optical Engineering, Vol. 24, p.p. 220-224, 1985, "Optoelectronic Switch Matrices: Recent Developments" by R. I. MacDonald et al). As detectors in an optical communication link, they offer commensurate responsivity and bandwidth similar to the more common P-N and P-I-N photodiodes. The planar structures employed in the photoconductor fabrication allow ease of monolithic integration. A large area epitaxial photoconductive detector was reported in an article, "An epitaxial Photoconductive Detector for High Speed Optical Detection", Proc. IEDM, 1979 p.p. 634–637 by J. C. Gammel et al. The photoconductive detector reported therein has an N+, p−, n+ structure which is used under bias conditions similar to a punched-through transistor. The injection boundary conditions cause the p− epitaxial layer to behave as a photoconductor, thus providing high speed photoconductive gain.

Photoconductors can be made in interdigitated configurations to preserve the short channel lengths necessary for high optical speed and gain, and yet give relatively large active areas for ease of optical coupling and low capacitance. Thus, C. Y. Chen et al report a heterostructure interdigitated photoconductive detector in "Interdigitated $Al_{0.48} In_{0.52} As/Ga_{0.47} In_{0.53} As$ Photoconductive Detectors", Applied Physics Letters, Vol. 44, No. 1, Jan. 1, 1984, p.p. 99–101. Their detector shows a rise time of 80 ps, a fall time of 1.2 ns and a peak responsivity seven times better than that of a commercial PIN photodiode. An article entitled "On the Responsive Behaviour of Fast Photoconductive Optical Planar and Coaxial Semiconductor Detectors" by H. Beneking, IEEE Trans. on Electron Devices, Vol ED-29, No. 9, Sept. 1982, p.p. 1431–1441, reviews fast optical detectors, which use photoconductive effects, in semiconducting channels or thin films.

The major disadvantage of most epitaxial photoconductors is their large bias current, which can be of the order of tens of mA at operating bias voltages of 10 V. The difficulty in making low-current GaAs photoconductors, for example, is that the resistivity of conventionally prepared, undoped epitaxial material is typically a few ohm-cm while the absorption length of the light to be detected is of the order of 1 $\mu$m. In consequence, the sheet resistivity of epitaxial photoconductive layers suitable for efficient photoconductors is 10–30 k$\Omega$ per square.

When interdigitaed photoconductor configurations (aspect ratio of less than $10^{-2}$) are used to achieve the narrow channel length required for significant photoconductive gain (less than about 10 $\mu$m) simultaneously with a large photosensitive area of about 100 $\mu$m square, the channel width is correspondingly large resulting in a resistance of a few hundreds ohms, and the dark current is usually of the order of a few milliamperes. Such high currents contribute to the detector noise and also cause an undesirable shift in the output level when the device is used as an optoelectronic crosspoint switch.

To avoid this problem photoconductors fabricated directly in Cr-compensated semi-insulating gallium arsenide have been reported in "Frequency and Pulse Response of a Novel High Speed Interdigital Surface Photoconductor (IDPC)" by C. W. Slayman et al, IEEE Electron Device Letters, Vol. EDL-2, No. 5, May 1981, p.p. 112–114. Cr dopants introduce electron traps that remove free carriers. These photoconductors exhibit very low bias currents (10 $\mu$A at 20 V bias). However the high density of deep traps shortens the lifetime of photogenerated carriers and the photoconductive gain is sacrificed.

U.S. Pat. No. 4,490,709, Dec. 5, 1984 Hammond et al describes an InP:Fe photoconductive device. Instead of GaAs doped with Cr in the above-referenced article by Slayman et al, Hammond et al use InP doped with Fe as semi-insulating semiconductive material. Metal contacts are directly deposited on the Fe doped Inp. Similar results to those obtained by Slayman et al are given in the patent.

OBJECTS OF THE INVENTION

It is therefore an object of the present invention to provide GaAs or other similar semiconductor photoconductive detectors having low noise.

It is another object of the present invention to provide photoconductive detectors which can operate with low bias current.

It is still another object of the present invention to provide photoconductive detectors which possess improved uniformity of frequency response.

SUMMARY OF THE INVENTION

Briefly stated, a photoconductive device of the present invention consists of an insulating or semi-insulating substrate on which is provided a channel layer of a semiconductive material which is undoped, low doped or compensated. The device further includes a pair of mutually separate metal contact electrodes on the channel layer. The said channel layer is thin enough that the depletion region created in the channel layer between the electrodes penetrates into the substrate Photons are directed to impinge upon the channel layer to generate a photocurrent between the electrodes.

BRIEF DESCRIPTION OF THE DRAWINGS

For a more complete understanding of the present invention and for further objects and advantages thereof, reference may now be made to the following description taken in conjunction with the accompanying drawings in which.

Figure 1:
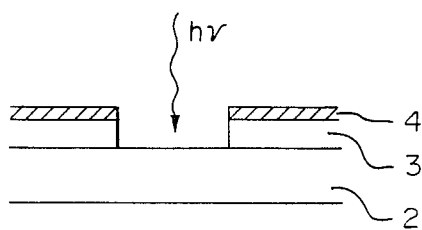
FIG. 1 is a cross sectional view showing the configuration of the photoconductive device according to the present invention.

DETAILED DESCRIPTION OF THE PREFERRED EMBODIMENT OF THE PRESENT INVENTION the epitaxial structure of the present invention is shown in FIG. 1. A semi-insulating or insulating substrate is designated by 1 on which a channel layer 2 is grown. A cap layer 3 is grown on the channel layer to ensure a good ohmic contact between the channel layer 2 and metal contact electodes 4. While other methods are possible, the photoconductor shown in FIG. 1 is fabricated by the following process. The channel layer 2 of unintentionally doped GaAs ($n^- \approx 5 \times 10^{14} cm^{-3}$) is grown by organo-metallic chemical vapour deposition (OMCVD) directly on an undoped semi-insulating substrate 1 to a nominal thickness of 1-2 μm. The undoped channel layer is overgrown with a cap layer (0.25–0.35 μm, $n^+ = 2 \times 10^{18}$ cm$^{-3}$) and a metal contact layer is formed on the cap layer 3 with evaporated and annealed Ni-Ge-Au. The metal contact layer is etched to form the electrode pattern and the cap layer is removed between the metal contact electrodes. This latter process step is performed with a calibrated etch (NH$_4$OH 2%, H$_2$O$_2$ 0.7%, H$_2$O 97.3%, 1500 A°/min at 23° C.), and the resistance of the device is monitored at 30 second intervals. Etching is stopped when the resistance increases from a few hundred ohms into the Megohm region. This occurs when the etch punctures the cap layer. The processes described are given by way of examples only and other well known etching processes are equally applicable to the present invention.

Since the undoped channel layer 2 is intact in this device, and would ordinarily result in device resistance of a few hundred ohms, the observed very high device resistance indicates that the channel is entirely depleted by surface effects. This is because the surface depletion layer thickness for the low doped $n^-$ layer is estimated to be a few microns. The channel layer being only 1 μm thick results in a totally depleted channel, that is to say, the depletion region created in the channel layer between the electrodes penetrates into the substrate.

Figure 2:
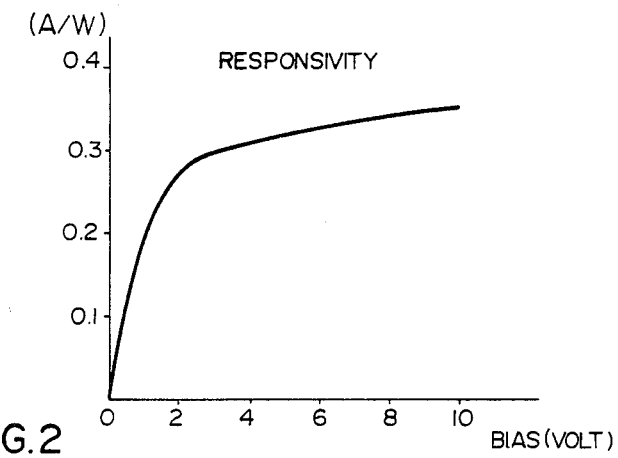
FIG. 2 is a graph showing the responsivity measured on a device fabricated according to the present invention.

The optical response was observed by illuminating the photoconductive devices with a GaAlAs-GaAs laser diode with a wavelength of 820 nm and modulated at 400 MHz. The photoconductor has an overall dimension of 100 μm × 100 μm interdigitated with 10 μm finger spacing. The responsivity of the photoconductor is shown in FIG. 2. It initially increases with voltage until it saturates at about 2 Volts. At this voltage the internal electric field is sufficient to produce carrier velocity saturation. The carrier velocity saturation limits the photoconductive gain which in turn limits the responsivity. The theoretical responsivity is calculated as:

$$R = (\eta e g / h\nu)$$

where
  $\eta$ = quantum efficiency
  e = electronic charge
  h = Planck's constant
  $\nu$ = frequency
  g = photoconductive gain The quantum efficiency is comprised of the Fresnel reflection coefficient, the coverage of a portion of the active area by the metallic interdigitated fingers, and the absorption of light in the active channel. A quantum efficiency of 18% is estimated. Substituting this into the equation above and comparing the result with the experimental observation as shown in FIG. 2 indicate that a photoconductive gain of 2.5 is present.

The DC responsivity in these surface depleted photconductors is typically only a factor of 2 or 3 greater than the responsivity at RF frequencies. This ratio is less than that observed in many other photoconductors and would ease considerably the problem of frequency equalization in photoconductive receivers. The reduced difference between low frequency and high frequency response is attributed to the reduction of contributions from phototransistor-like action through optical modulation of the channel width that occurs in structures that are incompletely depleted. Since the channel is always completely depleted in these devices, mechanisms such as optical back gating cannot modulate the impedance of the device.

Figure 3:
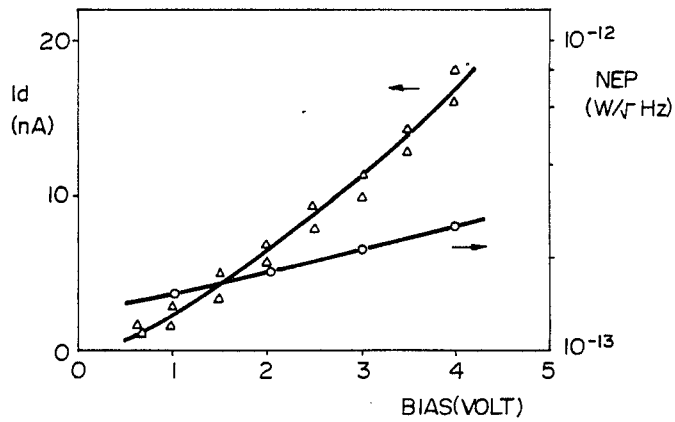
FIG. 3 shows the bias current and the noise equivalent power characteristics of such a device as a function of the applied bias voltage.

The experimental results of the bias current and the noise equivalent power (NEP) as a function of the applied bias as shown in FIG. 3. These measurements were taken on a photoconductor of dimension 20 μm × 20 μm. The bias current and the NEP at 4 volts bias are 17 nA and $2.3 \times 10^{-13}$ w/$\sqrt{Hz}$ respectively. At this bias, the dark resistance is about 240MΩ. These values are considerably better than those of conventional photoconductors and approach photodiode performance. Operation beyond 4 V showed instability and a larger rate of increase in the bias current and the NEP. This may be due to a high field effect such as impact ionization The depleted channel photoconductors of the present invention were also evaluated as broadband optoelectronic crosspoints. Such crosspoints are used in switching matrices whereby broadband signals are routed, distributed, or broadcast from a number of outputs. The signals to be switched are introduced optically into the crosspoints. The switching is accomplished by varying the bias applied to the crosspoints. For photoconductors, the on and off conditions correspond to the biassed and unbiassed conditions respectively. Photoconductors are most suitable for switching operation because they possess very fast electrical switching time and very high isolation values. These are the key parameters in the development of practical switching systems. Switching time and isolation are independent parameters in photoconductors but not in other semiconductor switches. For instance, a forward bias is required in a photodiode in order to achieve high isolation. This introduces storage charge which in turn results in a slow turn-on time. Switching time and isolation are therefore related in a conflicting manner in photodiodes.

Figure 4:
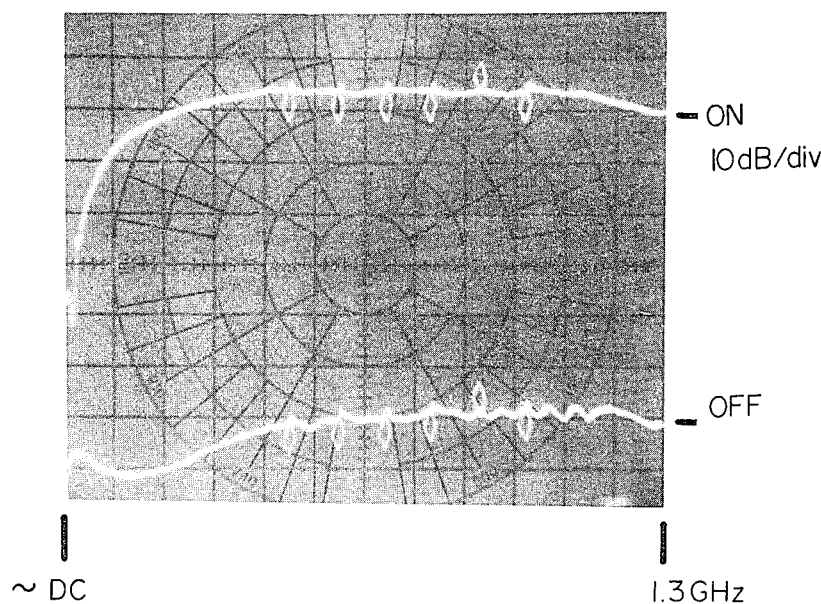
FIG. 4 is a photograph showing the isolation values measured on the device of the present invention.

The isolation value of a typical depleted channel photoconductor is shown in FIG. 4. The upper trace shows the frequency response of the channel depleted photoconductor mounted on a microstrip line circuit biased at 4 V. The response is very flat to $\approx 1.3$ GHz. (The cutoff below 300 MHz is due to a high pass network in the laser driver). The lower trace shows a 60 dB reduction in response when the bias is not applied. A particular advantage of these depleted channel devices as optoelectronic switches is the reduced dc offset that results from the reduced dc photoresponse as well as the low bias current.

The electrical switching time was measured by introducing a variable time delay between the laser and the bias pulses applied to the photoconductor. The lead time required for the bias pulse with respect to the laser pulse to acquire a 90% response from the photoconductor is the turn-on time. In a similar fashion the time for the response to fall to 10% is the turn-off time. The turn-on and the turn-off times for the depleted channel photoconductor were measured to be 0.3 and 0.5 ns respectively, the difference being mainly due to the asymmetry in the bias pulse. Optoelectronic crosspoint switching speeds offered by these detectors are much faster than those offered by photodiodes.

As described above, the channel layer in the photoconductors of the present invention is thinner than the surface depletion layer produced at the GaAs-air interface. It is therefore possible to improve the efficiency of the detector by matching the channel thickness more closely to the depletion depth. It is also possible to fabricate the depleted channel photoconductors of the present invention with semiconductive material other than GaAs. For example, other III-V compounds, such as InP, GaInAs or Si on saphire are examples of such materials. Configurations other than that shown in FIG. 1 can be employed depending upon materials used. For example, the cap layer shown in the figure can be eliminated. Or on the other hand, the substrate may comprise a second buffer layer contacting the channel layer. This buffer layer may be made of a different material from that of the remaining substrate or may be made by doping a part of the substrate differently from the other part.

In conclusion the depleted channel photoconductors of the present invention have significantly reduced bias current, lower noise, and flatter frequency response than similar photoconductors made with doped or undepleted channels. Their performance as optoelectronic crosspoint switches is comparable or better than other photoconductors. A photoconductive gain of 2.5, a dark current in the nanoampere region, a NEP of the order of $10^{-13}$ w/$\sqrt{Hz}$, an isolation value of 60 dB over 1.3 GHz bandwidth and an electrical switching time of 0.3 ns have been achieved. These properties make the depleted layer photoconductors of interest for many optical communication applications. An additional feature of these devices is that their higher impedance permits a correspondingly higher load resistor to be used, consistent with R-C time constant constraints, in order to provide higher voltage outputs. The reduced bias current ensures that excessive bias power in not dissipated in the load resistor. The latter dissipation can be significant in large scale optoelectronic switching applications.

We claim:
1. A photoconductive device, comprising:
a substrate made of a material selected from a group consisting of electrically semi-insulating and insulating substances;
a channel layer on the substrate, the said channel layer being made of a semiconductive material selected from a group consisting of undoped, low doped and compensated semi-conductive substances; and
a pair of mutually separated metal contact electrodes on the channel layer;
the said channel layer being thin enough that the depletion region created therein between the electrodes penetrates into the said substrate,
so that
photons impinging upon the channel layer generate a photocurrent therein between the said electrodes.

2. The photoconductive device according to claim 1 wherein:
the substrate is made of an inusulating or semi-insulating GaAs; and
the channel layer is made of undoped, low doped, or compensated GaAs.

3. The photoconductive device according to claim 2, further comprising:
a cap layer being provided between the metal contact electrodes and the channel layer to ensure good ohmic contacts therebetween.

4. The photoconductive device according to claim 3, wherein:
the substrate comprises a buffer layer which contacts the channel layer.

5. The photoconductive device according to claim 4, wherein:
the said buffer layer is made of a material different from that of the remaining part of the substrate.

6. The photoconductive device according to claim 2 wherein:
the pair of mutually separated metal contact electrodes are interdigitated.

7. A photoconductive device, comprising:
a undoped semi-insulating or insulating substrate;
a channel layer on the substrate, the said channel layer being on the order of 1–2 $\mu$m thick and made of undoped GaAs having the dopant concentration of less than $5 \times 10^{-14}$ cm$^{-3}$;
a pair of mutually separated Ni-Ge-Au metal contact electrodes; and
an n$^+$ cap layer provided between the channel layer and the pair of the contact electrodes, the said cap layer being on the order of 0.25 $\mu$m thick and having the dopant concentration of more than $10^{18}$ cm$^{-3}$;
so that
photons impinging upon the channel layer generate a photocurrent between the said contact electrodes.

8. The photoconductive device according to claim 7 wherein:
the substrate is made of GaAs.

9. The photoconductive device according to claim 8 wherein:
the pair of mutually separated metal contact electrodes are interdigitated.

10. The photoconductive device according to claim 8 wherein:
the substrate comprises a buffer layer which contacts the channel layer.

11. The photoconductive device according to claim 10 wherein:
the said buffer layer is made of a material different from that of the remaining part of the substrate.

* * * * *